(12) United States Patent
Rajan et al.

(10) Patent No.: US 9,904,759 B1
(45) Date of Patent: *Feb. 27, 2018

(54) SYSTEM FOR CONCURRENT TARGET DIAGNOSTICS FIELD

(71) Applicant: CADENCE DESIGN SYSTEMS, INC., San Jose, CA (US)

(72) Inventors: Sundar Rajan, Palo Alto, CA (US); Charles R. Berghorn, Staatsburg, NY (US); Mitchell G. Poplack, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/617,252

(22) Filed: Jun. 8, 2017

Related U.S. Application Data

(62) Division of application No. 14/933,677, filed on Nov. 5, 2015, now Pat. No. 9,697,324.

(51) Int. Cl.
*G06F 17/50* (2006.01)

(52) U.S. Cl.
CPC ...... *G06F 17/5081* (2013.01); *G06F 17/5027* (2013.01); *G06F 17/5054* (2013.01)

(58) Field of Classification Search
CPC .......... G06F 9/455; G06F 11/26; G06F 11/36; G06F 17/5009; G06F 17/5027; G06F 17/5054
USPC .................................................. 716/106, 116
See application file for complete search history.

(56) References Cited

U.S. PATENT DOCUMENTS

| | | |
|---|---|---|
| 5,036,473 A | 7/1991 | Butts et al. |
| 5,109,353 A | 4/1992 | Sample et al. |
| 5,425,036 A | 6/1995 | Liu et al. |
| 5,475,830 A | 12/1995 | Chen et al. |
| 5,551,013 A | 8/1996 | Beausoleil et al. |
| 5,960,191 A | 9/1999 | Sample et al. |
| 6,009,256 A | 12/1999 | Tseng et al. |
| 6,035,117 A | 3/2000 | Beausoleil et al. |
| 6,051,030 A | 4/2000 | Beausoleil et al. |
| 6,618,698 B1 | 9/2003 | Beausoleil et al. |
| 7,739,093 B2 | 6/2010 | Beausoleil et al. |
| 8,275,588 B2 | 9/2012 | Cha |

(Continued)

OTHER PUBLICATIONS

Mike Butts; "Logic Emulation and Prototyping: It's The Interconnect (Rent rules);" RAMP at Stanford; Aug. 2010; 31 pages.

(Continued)

*Primary Examiner* — Paul Dinh
(74) *Attorney, Agent, or Firm* — Arnold & Porter Kaye Scholer LLP

(57) ABSTRACT

A system for concurrent target diagnostics is disclosed. The system comprises dedicated FPGA for generating test data to test target connections between an emulator and a target system. In this way, domains of the emulator may continue to emulate at least a portion of a hardware design during the testing of the target connections. Further, a multiplexer operable to select target connections for testing eliminates errors resulting from manual swapping of target connections during the testing process. The system further comprises multiple paths to a target pod. The paths enable monitoring and reporting on the status of target connections between an emulator and a target system.

9 Claims, 4 Drawing Sheets

(56) References Cited

U.S. PATENT DOCUMENTS

| | | |
|---|---|---|
| 9,379,846 B1 | 6/2016 | Poplack et al. |
| 9,647,688 B1 | 5/2017 | Poplack et al. |
| 2006/0029100 A1 | 2/2006 | Dove |
| 2007/0299999 A1 | 12/2007 | Duerk et al. |
| 2008/0109707 A1 | 5/2008 | Dell et al. |
| 2009/0271174 A1 | 10/2009 | Cha |
| 2011/0099407 A1 | 4/2011 | Jonas |
| 2011/0182191 A1 | 7/2011 | Jackson |
| 2011/0264436 A1 | 10/2011 | Ni et al. |
| 2015/0089289 A1 | 3/2015 | Gahoi et al. |
| 2016/0371407 A1* | 12/2016 | Larzul ................. G06F 17/5009 |

OTHER PUBLICATIONS

Mitchell G. Poplack, et al.; U.S. Appl. No. 14/578,100, filed Dec. 19, 2014, entitled "System and Method of Encoding in a Serializer/Deserializer".

Charles R. Berghorn, et al.; U.S. Appl. No. 14/920,742, filed Oct. 22, 2015, entitled "System and Method for a Consolidated Emulator to Workstation Connection".

Charles R. Berghorn, et al.; U.S. Appl. No. 14/920,777, filed Oct. 22, 2015, entitled "System and Method for Concurrent Interconnection Diagnostics Field".

Sundar Rajan, et al.; U.S. Appl. No. 14/933,677, filed Nov. 5, 2015 entitled "System for Concurrent Target Diagnostics Field".

Mitchell G. Poplack, et al.; U.S. Appl. No. 15/165,891, filed May 26, 2016 entitled "System and Method of Encoding in a Serializer/Deserializer".

* cited by examiner

SYSTEM FOR CONCURRENT TARGET DIAGNOSTICS FIELD

CROSS-REFERENCE TO RELATED APPLICATION

This application is a divisional application and claims the benefit of U.S. patent application Ser. No. 14/933,677, filed Nov. 5, 2015, now issued as U.S. Pat. No. 9,697,324 U.S. patent application Ser. No. 14/933,677 is hereby incorporated herein by reference in its entirety.

This patent application is also related to U.S. Pat. No. 9,379,846, entitled "System and Method of Encoding in a Serializer/Deserializer," issued on Jun. 28, 2016, and U.S. Pat. No. 9,647,688, entitled "System and Method of Encoding in a Serializer/Deserializer, issued on May 7, 2017. U.S. Pat. Nos. 9,379,846 and 9,647,688 are hereby incorporated by reference in their entirety.

This patent application relates generally to the field of verifying the functionality of integrated circuit designs prior to fabrication. In particular, the present patent document relates to systems for concurrent target diagnostics.

BACKGROUND

Functional verification systems, including hardware emulation systems and simulation acceleration systems, utilize interconnected programmable logic chips or interconnected processor chips. Examples of systems using programmable logic devices are disclosed in, for example, U.S. Pat. No. 6,009,256 entitled "Simulation/Emulation System and Method," U.S. Pat. No. 5,109,353 entitled "Apparatus for emulation of electronic hardware system," U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 6,009,256, 5,109,353, 5,036,473, 5,475,830, and 5,960,191 are incorporated herein by reference. Examples of hardware logic emulation systems using processor chips are disclosed in, for example, U.S. Pat. No. 6,618,698 "Clustered processors in an emulation engine," U.S. Pat. No. 5,551,013 entitled "Multiprocessor for hardware emulation," U.S. Pat. No. 6,035,117 entitled "Tightly coupled emulation processors," U.S. Pat. No. 6,051,030 entitled "Emulation module having planar array organization," and U.S. Pat. No. 7,739,093 entitled "Method of visualization in processor based emulation system." U.S. Pat. Nos. 6,618,698, 5,551,013, 6,035,117, 6,051, 030, and 7,739,093 are incorporated herein by reference.

Functional verification systems help to shorten the time it takes to design a customized application specific integrated circuits (ASICs) by allowing designers to emulate the functionality of the ASIC before a production run has begun. Functional verification systems help to ensure ASICs are designed correctly the first time, before a final product is produced.

In some instances, functional verification systems comprise emulators in communication with a target system to emulate at least a portion of a hardware design. The target system comprises real-world hardware operating at near real-time clock frequencies. The target system can be thought of as the system in which the electronic design being verified in the emulator will be installed once manufactured. The ability to run the emulated design under test in the electronic system the manufactured device will eventually be installed within provides significant advantages. For example, being able to run the emulated design in the system in which the final integrated circuit will be installed can provide additional confidence in the verification process. In addition, once the design is debugged, the ability to run the design in the system for which it will be installed allows further development of the target system to take place. For example, such concurrent use allows development of firmware of the final system.

The emulator comprises ASICs and/or FPGAs used to emulate a portion of the hardware design. Communication between the target system and the emulator enables verification of a hardware design in near real-time.

The emulator and target system are in communication via connections such as Ethernet or optical fiber. However, these connections need to be periodically tested for failure. For example, an emulator emulating a hardware design may be in communication with a target system. The functional verification system may indicate that the emulated hardware design does not operate as expected. The hardware designer may then wish to check the target connection because he suspects the problem lies with the target connections, rather than with the hardware design. Also, after maintenance on the functional verification system, such as replacing the target connections or target system, a field services engineer (FSE) may need to check the target connections to ensure they are working properly.

In current systems, testing the connections between emulators and the target system presents two challenges. First, domains comprising ASICs or FPGAs implement test logic to send test signals across the connection. This results in the domain being taken "offline," during which time it cannot be used to emulate the hardware design. Second, testing the connection requires swapping out the cables between the emulator and the target system. This is because the test logic may return an error. However, it is not possible to tell whether the error results from a fault with the connection or whether the logic has been corrupted at the end points, the domains or the target system.

Although the present systems for target diagnostics are useful to a degree, there still exists a need in the field for improved systems for target diagnostics. Thus, for at least these reasons there is a need for an improved system for concurrent target diagnostics that enable the domains to remain in use while testing the target connection. There is also a need for a target diagnostic system and method that does not require manual swapping of the target connections.

SUMMARY

Systems for concurrent target diagnostics are disclosed and claimed herein. The system of the present disclosure enables domains of an emulator to continue emulating at least a portion of a hardware design while testing the target connections between an emulator and a target system. Further, the teachings of the present disclosure enable automatic swapping of target connections to reduce errors during the testing process.

In one embodiment, the present disclosure utilizes a dedicated field programmable gate array (FPGA) for generating test data for testing target connections between an emulator and a target system. The FPGA may, for example, generate serializer/deserializer communications having error correction code (ECC) check bits. The ECC check bits may be used to check whether the communication was received properly over the target connection. The use of the FPGA allows the domains of the emulator to continue emulating a portion of a hardware design while the target connections are tested.

In another embodiment, the present disclosure utilizes a multiplexer (mux) to automatically swap target connections during the testing process. Swapping target connections during the testing process may be necessary to determine whether an error from the testing process results from a problem within the emulator or with the target connection itself. Utilizing the mux of the present disclosure to automatically swap target connections during the testing processes eliminates errors caused by manual swapping.

In another embodiment, the present disclosure utilizes dual paths between the emulator and the target connection in order to check the target connections. For example, a first path comprising an Ethernet connection may be used for diagnostics. A second path comprising optical fiber may be used to transfer design data and also during the testing process. A target system FPGA is utilized in testing of the first path. A board manager is utilized in testing of the second path. The target system FPGA and the board manager communicate on the status of the first and second paths.

The board manager is operable to report on the status of the first and second paths. Thus, the board manager is useful in reporting on the status of the first path if the first path has failed. Likewise, the target system FPGA is operable to report on the status of the first and second paths. Thus, the target system FPGA is operable to report on the status of the second path if the first path has failed.

The first path may be used to check whether the second path is operating properly and vice versa.

These and other objects, features, aspects, and advantages of the embodiments will become better understood with reference to the following description and accompanying drawings.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
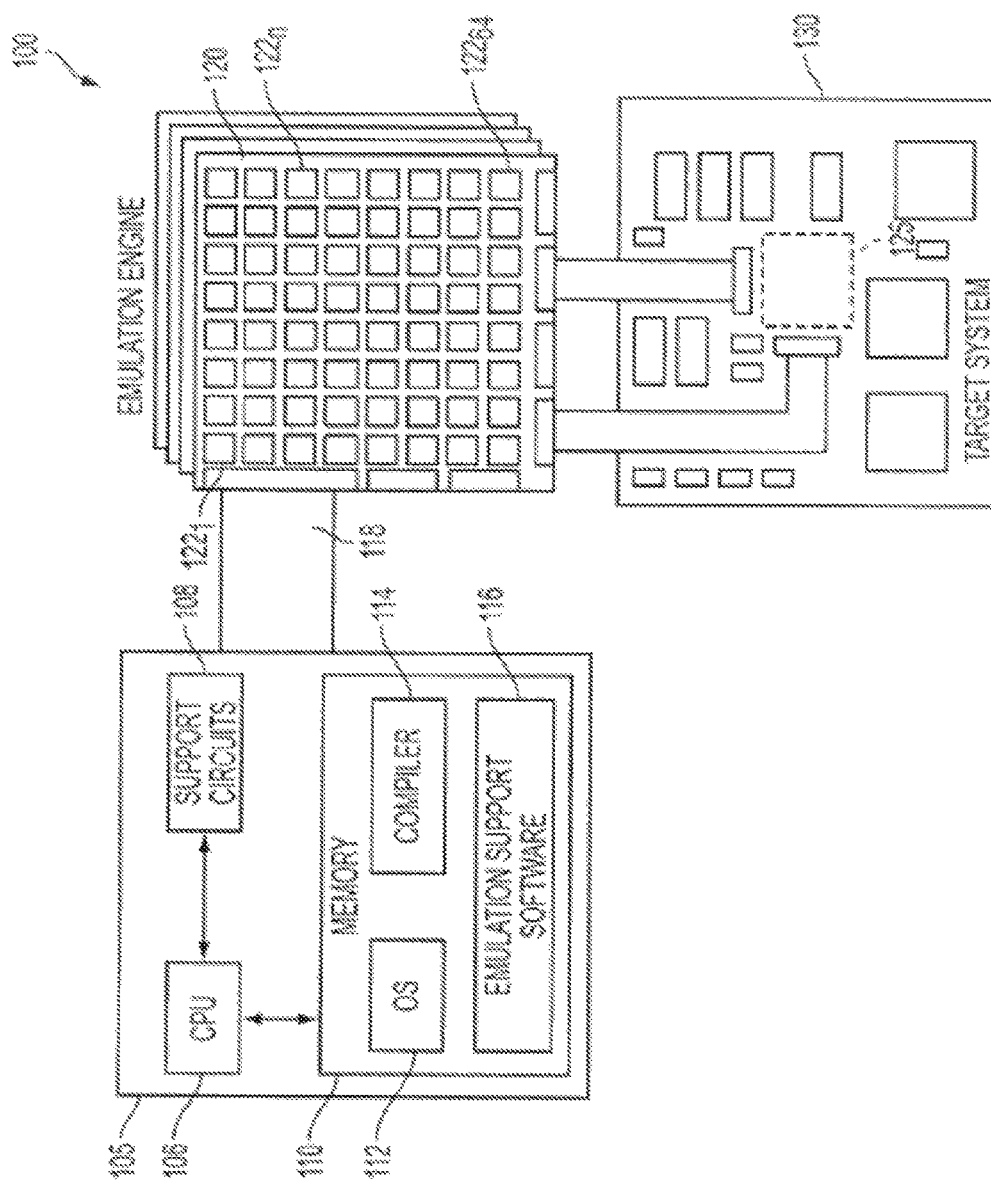
FIG. 1 illustrates an overview of one embodiment of a processor-based emulation system 100.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A system for concurrent target diagnostics is disclosed herein. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm may be here, and generally, conceived to be a self-consistent sequence of steps leading to a desired result. The steps may be those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), erasable programmable read-only memories (EPROMs), electrically erasable programmable read-only memories (EEPROMs), magnetic or optical cards, or any type of media suitable for storing electronic instructions, and each coupled to a computer system bus.

Any algorithms that may be presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 illustrates an overview of an embodiment of a processor-based emulation system 100. The system comprises a host or computer workstation 105, an emulation engine including at least one emulation board 120, and a target system 130. While a processor-based emulation engine is described, though other emulation engines, such as those utilizing arrays of programmable logic devices (such as FPGAs) may also be used, for example properly-configured versions of the systems discussed above.

The host workstation 105 provides emulation support facilities to the emulation engine 100 and emulation board 120. The host workstation 105, for example a personal computer, may comprise at least one central processing unit (CPU) 106, support circuits 108, and a memory 110. The CPU 106 may comprise one or more conventionally available microprocessors and/or microcontrollers. The support circuits 108 may be well known circuits that are used to support the operation of the CPU 106. These supporting circuits may comprise power supplies, clocks, input/output interface circuitry, cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 may store various forms of software and files for the emulation system, such as an operating system (OS) 112, a compiler 114, and emulation support software 116.

The compiler 114 converts a hardware design, such as hardware described in VHDL or Verilog programming language, to a sequence of instructions that can be evaluated by the emulation board 120.

The host workstation 105 allows a user to interface with the emulation engine 100 via communications channel 118, including emulation board 120, and control the emulation process and collect emulation results for analysis. Under control of the host workstation 105, programming information and data is loaded to the emulation engine 100. In other embodiments, the functionality of host workstation may be part of the emulation system 100 itself. For example, emulation system 100 may also include microprocessor, for example, an x86 microprocessor and data storage such as hard disk drives (HDDs). In this way, the x86 microprocessor and HDDs may be used similar to a host workstation to load designs onto the emulation system 100. This is particularly advantageous in the case of diagnostics and small designs that can be loaded onto emulation system 100 without involvement of external workstations.

The emulation board 120 has on it a number of individual emulation chips, for example the 64 emulation chips $122_1$ to $122_{64}$ (collectively 122) shown in FIG. 1, in addition to miscellaneous support circuitry. There may be any number of emulation chips. The emulation chips 122 are designed to mimic the functionality of any synchronous ASIC design using programmable logic. This is done in order for chip designers to prototype their ASIC design using processor based emulation before having actual silicon in hand. Communication between emulation chips 122 is established via serial I/Os links. There may be numerous output lanes per emulation chip 122. Some of the I/Os links may remain on the card on copper. For longer connections to other cards, the signals may be relayed through optical transceivers and cables.

In response to programming received from the emulation support software 116, emulation engine 100 emulates a portion 125 of the target system 130. Portion 125 of the target system 130 may be an integrated circuit, a memory, a processor, or any other object or device that may be emulated in a programming language. Exemplary emulation programming languages include Verilog and VHDL.

Figure 2:
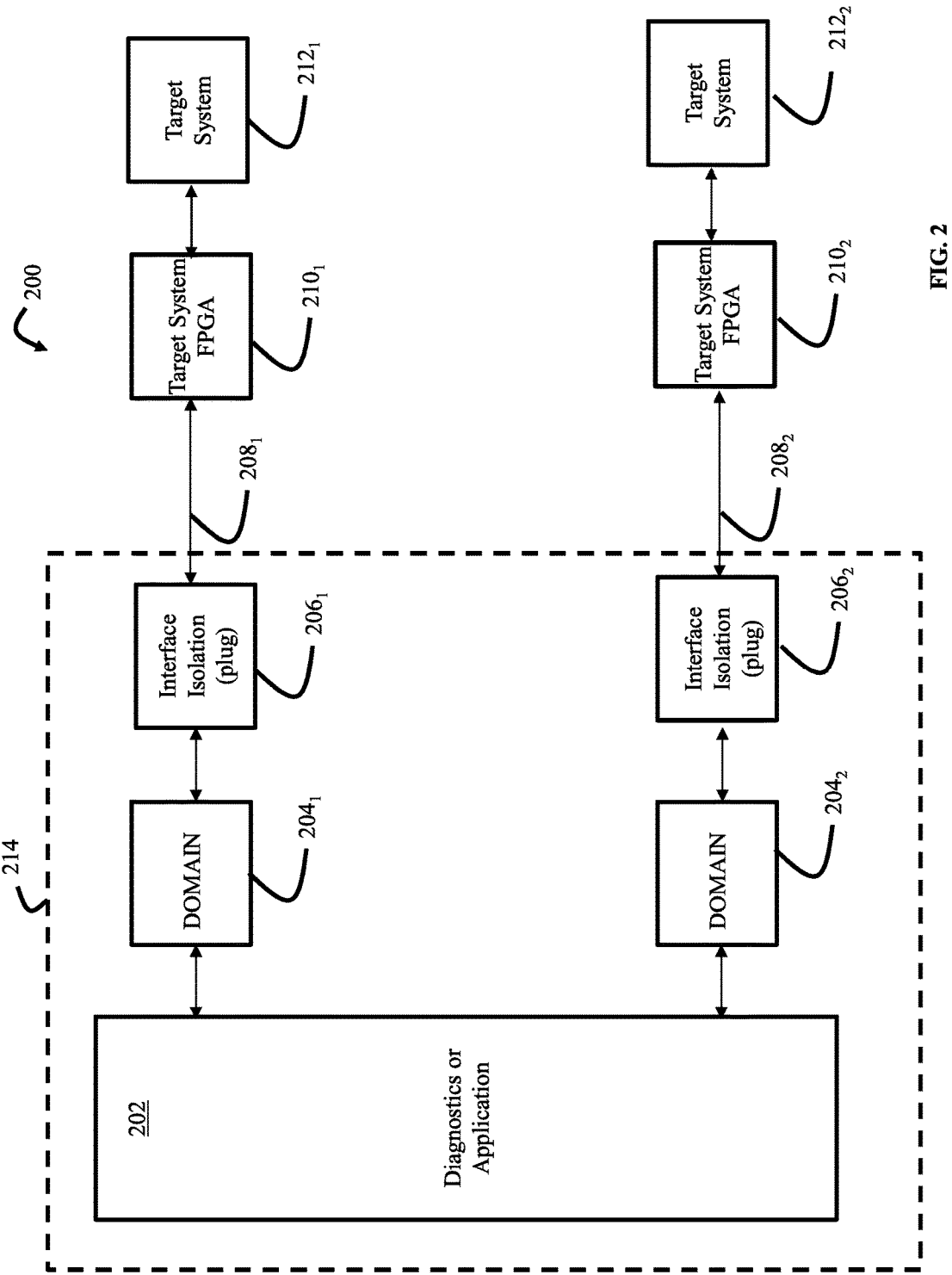
FIG. 2 illustrates an overview of functional verification system utilizing domains for target diagnostics.

FIG. 2 shows functional verification system 200 that utilizes domains in the testing of target connections. Functional verification system 200 comprises emulator 214, target system FPGAs $210_1$ and $210_2$, and target system $212_2$. Emulator 214 comprises diagnostics or applications 202, domains $204_1$ and $204_2$, interface isolations $206_1$ and $206_2$. Emulator 214 communicates with target system 212 via target connections $208_1$ and $208_2$.

Diagnostics or applications 202 test target connections $208_1$ and $208_2$. Further, diagnostics or applications 202 drive emulation processes occurring in domains $204_1$ and $204_2$. In testing target connections $208_1$ and $208_2$, diagnostics or applications 202 may send test signals across target connections $208_1$ and $208_2$ for testing those connections for failure.

As shown in functional verification system 200, diagnostics or applications 202 drive domains $304_1$ and $304_2$ to send test signals across interconnections $208_1$ and $208_2$. This results in domains $204_1$ and $204_2$ being taken offline and unavailable for emulating a portion of the hardware design. Diagnostics or applications 202 further drive domains $204_1$ and $204_2$ in emulation of a portion of a hardware design.

Domains $204_1$ and $204_2$ comprise emulation ASICs and/or FPGAs. Domains $204_1$ and $204_2$ are used to emulate a portion of hardware design to verify the functionality of a hardware design prior to fabrication. Although only two domains $204_1$ and $204_2$ are shown in FIG. 2, one of ordinary skill in the art will understand that functional verification system 200 may comprise many domains. Functional verification system may likewise comprise more interface isolations, target system FPGAs, target systems, and target connections. Each domain is operational to emulate a portion of a hardware design.

Domains $204_1$ and $204_2$ are coupled to interface isolation $206_1$ and $206_2$ for example via a parallel copper wire connection. As discussed, domains $204_1$ and $204_2$ emulate a portion of a hardware design. Such domains $204_1$ and $204_2$ may send data generated during the emulation process to target system $212_1$ and $212_2$. Domains $204_1$ and $204_2$ transfer design data to target systems $212_1$ and $212_2$ via target connections $208_1$ and $208_2$. Target connections $208_1$ and $208_2$ may comprise, for example, a parallel copper wire connection.

Periodically, target connections $208_1$ and $208_2$ may need to be tested for failure. When testing target connections $208_1$ and $208_2$, domains $204_1$ and $204_2$ generate test data for testing the connections. During this time, domains $204_1$ and $204_2$ cannot be used to generate design data. Further, target connections $208_1$ and $208_2$ cannot be used in the emulation process.

Target connections $208_1$ and $208_2$ may also need to be interchanged with other connections during the testing process. The testing process may be incapable of isolating problems with the target connection. Rather, a test failure may indicate a failure in a portion of the domain or target system rather than a failure of the target connection itself. Thus, if the target connection is swapped out for a new connection and the test again results in failure, the problem is likely due to error in the domain or target system rather than the target connection itself. However, changing target connections $208_1$ and $208_2$ in functional verification system 200 is a manual process and may itself introduce errors in the testing process. A field services engineer (FSE) may change the target connections by physically removing the target connection and swapping the old target connection with a new connection, which may introduce errors. For example, changing target connections may result in the pins to the target connection interface becoming bent, resulting in errors in sending signals across target connections.

Thus, a concurrent diagnostic system that allows domains $204_1$ and $204_2$ to remain in use while testing target connections $208_1$ and $208_2$ is desirable. Further, a concurrent diagnostic system that allows automatic swapping of target connections $208_1$ and $208_2$ to isolate problems in the target connection is also desirable.

Target system FPGAs $210_1$ and $210_2$ match the electrical characteristics of the emulator to the target systems $210_1$ and $210_2$. Further, target system FPGAs $210_1$ and $210_2$ manage communications between the emulator and the target systems $212_1$ and $212_2$. In order to match the electrical characteristics of the emulator to the target systems $212_1$ and $212_2$, target system FPGAs $210_1$ and $210_2$, for example, matches voltages or type of input (single-ended, differential)

Target system FPGAs $210_1$ and $210_2$ also manage communications between the target system $212_1$ and $212_2$. Target system FPGAs $210_1$ and $210_2$ precisely time communication between domains $204_1$ and $204_2$ and target system $212_1$ and $212_2$. During the emulation of a portion of a hardware design, the communications between domains $204_1$ and $204_2$ and target system $212_1$ and $212_2$ must be timed so that signals are received at the right time in the emulation process. Otherwise, signals would be received out of order and would not mimic the actual operation of the hardware design in fabricated hardware.

Target systems $212_1$ and $212_2$ comprise real-world hardware operating at real-time clock frequencies. Thus, emulator 214 and target systems $212_1$ and $212_2$ may be in communication to emulate at least a portion of a hardware design in near real-time.

Figure 3:
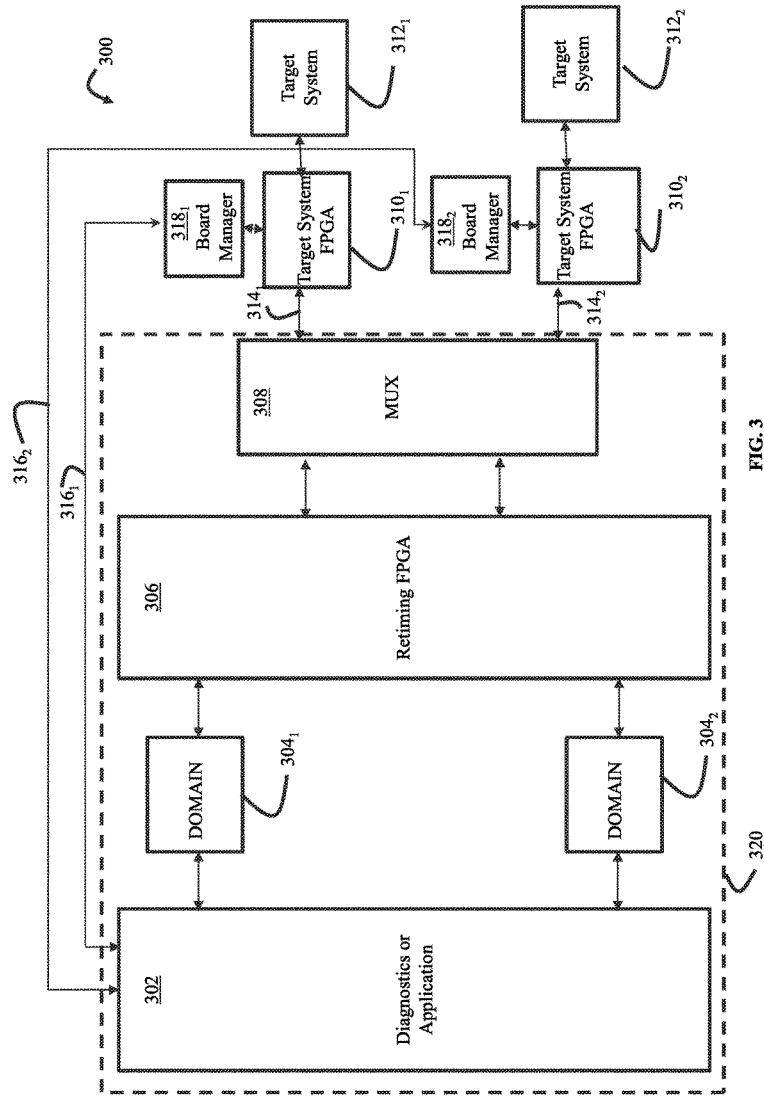
FIG. 3 illustrates overview of functional verification system enabling concurrent target diagnostics.

FIG. 3 shows improved functional verification system 300. Functional verification system 300 enables testing connections from the functional verification system 300 to the target system without utilizing domains to generate test data. Thus, the domains may continue to emulate a portion of a hardware design and do not need to be taken offline when testing target connections. Functional verification system 300 further enables automated swapping of target connections. Thus, functional verification system 300 eliminates errors due to manual swapping during the testing process.

Functional verification system 300 comprises emulator 320, target system FPGAs $314_1$ and $314_2$, target systems $312_1$ and $312_2$, and board managers $318_1$ and $318_2$. Emulator 320 comprises diagnostic or application 302, domains $304_1$ and $304_2$, retiming FPGA 306, multiplexer (mux) 308. Emulator 320 is connected to target systems $312_1$ and $312_2$ via target connections $314_1$, $314_2$, $316_1$, and $316_2$. Although not illustrated in FIG. 3, board managers and target system FPGA may form a target pod as is explained in connection with FIG. 4. Although emulator 320 is illustrated with diagnostics or applications 302 in FIG. 3, diagnostics or applications 302 may be separate hardware and/or software on a host workstation coupled to functional verification system 300.

Diagnostics or applications 302 monitors connections $314_1$, $314_2$, $316_1$, and $316_2$ for failure. Further, diagnostics or applications 202 drive emulation processes occurring in domains $304_1$ and $304_2$. When retiming FPGA 306 sends test signals to target system FPGA $310_1$ and $310_2$ for testing target connections $314_1$ and $314_2$, the test signals may be received improperly, indicating a failure in testing of target connections $314_1$ and $314_2$. Target system FPGA $310_1$ and $310_2$ communicate the failure to board manager $318_1$ and $318_2$. Board manager $318_1$ and $318_2$ in turn communicate the failure in testing target connections $314_1$ and $314_2$ to diagnostics or application 302 via target connections $316_1$ and $316_2$.

Diagnostics or applications 302 may send test signals across target connections $316_1$ and $316_2$ for testing those connections for failure. Board manager $318_1$ and $318_2$ receive the test signals and determine whether the signals were received properly. If the test signals were received improperly, board managers $318_1$ and $318_2$ may communicate to target system FPGAs $310_1$ and $310_2$ the failure in testing target connections $316_1$ and $316_2$. The target system FPGAs $310_1$ and $310_2$ in turn communicate the failure to diagnostics or application 302 via target connections $314_1$ and $314_2$. In this way, one path between emulator and target system $312_1$ and $312_2$ may report the status of the other path.

Domains $304_1$ and $304_2$ comprise emulation ASICs and/or FPGAs. Domains $304_1$ and $304_2$ emulate a portion of hardware design to verify the functionality of a hardware design prior to fabrication. Although only two domains $304_1$ and $304_2$ are shown in FIG. 3, one of ordinary skill in the art will understand that functional verification system 300 may comprise many domains. Each domain is operational to emulate a portion of a hardware design. Functional verification system may likewise comprise more multiplexers, target system FPGAs, board managers, and target systems. FIG. 3 is illustrative of the teachings of the present disclosure.

Retiming FPGA 306 generates test data for testing target connections $314_1$ and $314_2$. Thus, domains $304_1$ and $304_2$ may continue to emulate a portion of a hardware design while target connections $314_1$ and $314_2$ are tested. For example, retiming FPGA 306 may comprise a serializer/deserializer with error correction code (ECC) check bits. The ECC check bits may be used to determine whether the communication from retiming FPGA 306 was received properly at target system FPGA $310_2$. Methods of sending serialized/deserialized communications with error correction codes are discussed in U.S. application Ser. No. 14/578,173, entitled "System and Method of Encoding in a Serializer/Deserializer," filed on Dec. 19, 2014, and U.S. application Ser. No. 14/578,100, entitled "System and Method of Encoding in a Serializer/Deserializer, filed on Dec. 19, 2014, incorporated by reference as if set forth in their entirety herein. In this way, domains $304_1$ and $304_2$ need not be used to generate test logic to test target interconnections $314_1$ and $314_2$.

Mux 308 selects the target connection used for communication between domains $304_1$ and $304_2$ and target systems $312_1$ and $312_2$. Mux 308 may be used during the emulation process, but is particularly advantageous when testing target connections $314_1$ and $314_2$. During the testing of target connections $314_1$ and $314_2$, mux 308 selects a first target connection for testing. For example, mux 308 may select target connection $314_1$. If the test of target connection $314_1$ results in failure, mux 308 may then select a second target connection $314_2$ for testing. Mux 308 selects the second target connection $314_2$ in order to verify the results from testing target connection $314_1$. That is, although the testing of target connection $314_1$ resulted in failure, it is not possible to determine whether the failure results from a problem with target connection $314_1$ or some problem within the emulator itself. If testing of target connection $314_2$ does not result in failure, it is likely that there is some fault with target connection $314_1$. However, if testing of target connection $314_2$ does result in failure, it is likely that there is a problem other than with target connection $314_1$. In this way, mux 308 enables automatic swapping of target connections to test target connections between an emulator and a target system. In previous systems, swapping target connections was a manual process that could itself introduce errors into the process of testing of target connections. Mux 308 enables automatic swapping to eliminate errors caused by manual swapping of target connections.

Target connections $314_1$ and $314_2$ couple emulator 320 and the target system $312_1$ and $312_2$. Target connections $314_1$ and $314_2$ may comprise, for example, optical fiber connections that transfer data using serializer/deserializer communications. Target connections $314_1$ and $314_2$ send design data generated by domains $304_1$ and $304_2$ to target system $312_1$ and $312_2$. Further, when testing target connections $314_1$ and $314_2$, these connections may carry test data used to test the connections.

Target system FPGAs $310_1$ and $310_2$ match the electrical characteristics of the emulator to the target systems $312_1$ and $312_2$. Further, target system FPGAs $310_1$ and $310_2$ manage communications between the emulator and the target systems $312_1$ and $312_2$. In order to match the electrical characteristics of the emulator to the target systems $312_1$ and $312_2$, target system FPGAs $310_1$ and $310_2$, for example, provide load balancing or load matching.

Target system FPGAs $310_1$ and $310_2$ also manage communications between the target system $312_1$ and $312_2$. Target system FPGAs $310_1$ and $310_2$ precisely time communication between domains $304_1$ and $304_2$ and target system $312_1$ and $312_2$. During the emulation of a portion of a hardware design, the communications between domains $304_1$ and $304_2$ and target system $312_1$ and $312_2$ must be timed so that signals are received at the right time in the emulation process. Otherwise, signals would be received out of order and would not mimic the actual operation of the hardware design in fabricated hardware. Target system FGPAs $310_1$ and $310_2$ also receive test signals from retiming FPGA via target connections $314_1$ and $314_2$. Target system FGPAs $310_1$ and $310_2$ may use the ECC check bits sent with the serializer/deserializer communications to test whether the signal was received properly. If the test signal was received improperly, target system FPGAs $310_1$ and $310_2$ may communicate this failure to board managers $318_1$ and $318_2$. Likewise, if board managers $318_1$ and $318_2$ report error in testing target connections $316_1$ and $316_2$, board managers $318_1$ and $318_2$ may communicate the error to target system FPGAs $310_1$ and $310_2$. Target system FPGAs $310_1$ and $310_2$ may communicate with diagnostics or applications 302 on the status of target connections $314_1$, $314_2$, $316_1$ and $316_2$.

Board manager $318_1$ and $318_2$ receive test signals from diagnostics or applications 302 via target connections $316_1$ and $316_2$. Board manager $318_1$ and $318_2$ may determine whether the test signals were received properly. If the test signal was received improperly, board managers $318_1$ and $318_2$ may communicate this failure to target system FPGAs $310_1$ and $310_2$. Likewise, if target system FPGAs $310_1$ and $310_2$ report error in testing target connections $314_1$ and $314_2$, target system FPGAs $310_1$ and $310_2$ may communicate the error to board managers $318_1$ and $318_2$. Board managers $318_1$ and $318_2$ may communicate with diagnostics or applications 302 on the status of target connections $314_1$, $314_2$, $316_1$ and $316_2$.

In this way, diagnostic or applications 302 may determine whether failure has occurred in target connections $314_k$, $314_2$, $316_k$, and/or $316_2$. Further, board manager $318_1$ and $318_2$ communicate on the status of target system FPGAs $310_1$ and $310_2$. Thus, board manager $318_1$ and $318_2$ may gather information on target system FPGAs $310_1$ and $310_2$ including the status of target connections $314_1$ and $314_2$, temperature of target system FPGAs $310_1$ and $310_2$, and the status of hardware pins on target system FPGAs $310_1$ and $310_2$, among other information. Board managers $318_1$ and $318_2$ may communicate this information back to diagnostic or applications 302.

Target systems $312_1$ and $312_2$ comprise real-world hardware operating at real-time clock frequencies. Thus, emulator and target systems $312_1$ and $312_2$ may be in communication to emulate at least a portion of a hardware design in near real-time.

Target connections $316_1$ and $316_2$ couple the emulator to the target system. Target connections $316_1$ and $316_2$ may comprise, for example, Ethernet connections. Target connections $316_1$ and $316_2$ primarily used in the set-up, monitoring, and diagnostics of target systems $312_1$ and $312_2$. Target connections $316_1$ and $316_2$ may be used to check the results from testing target connections $314_1$ and $314_2$, and vice versa. That is, target connections $316_1$ and $316_2$ may report on whether target connections $314_1$ and $314_2$ are operating, and vice versa.

Figure 4:
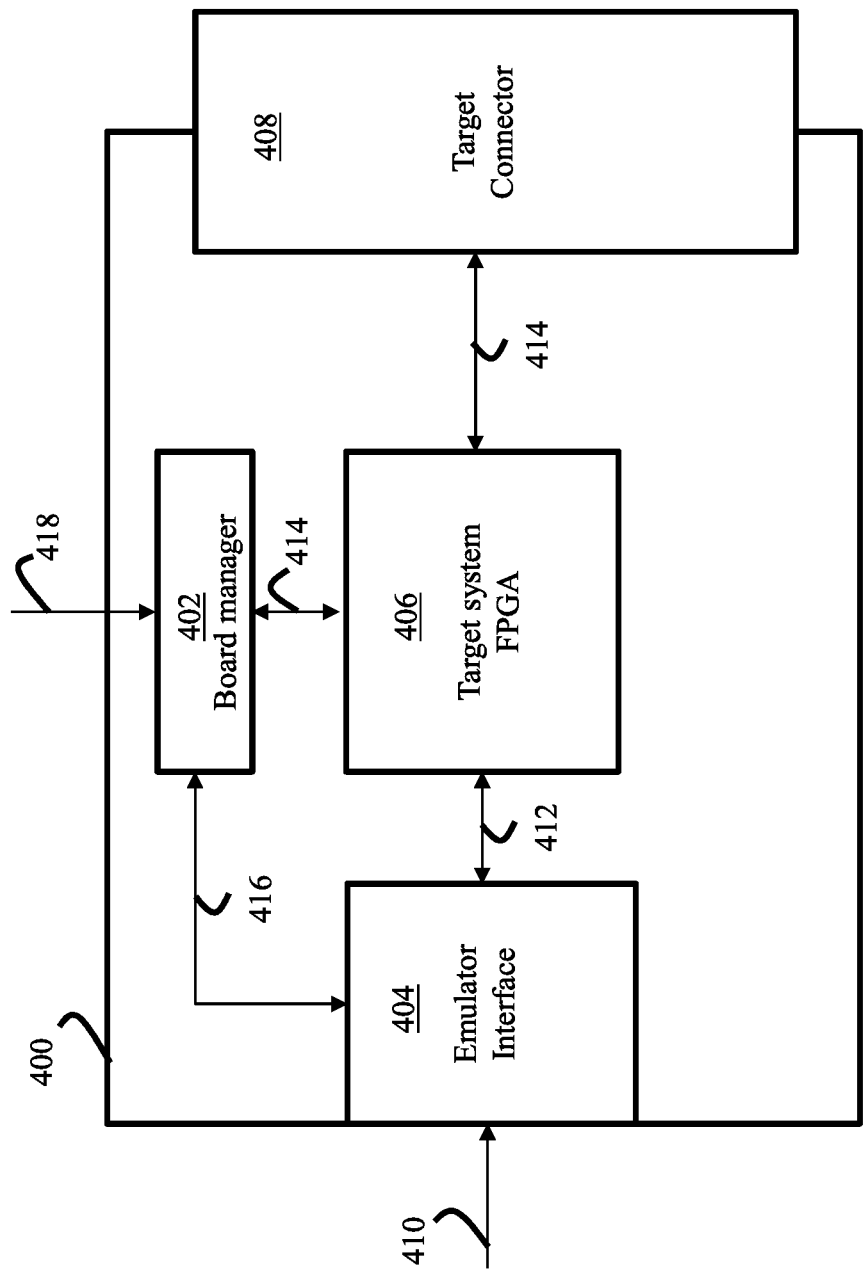
FIG. 4 illustrates target pod 400.

FIG. 4 shows target pod 400. Target pod 400 comprises board manager 402, emulator interface 404, target system FPGA 406, and target connector 408. Board manager 402 is coupled to emulator interface 404 via connection 416. Emulator interface 404 is coupled to target system FPGA 406 via connection 412. Target system FPGA 406 is coupled to board manager 402 via connection 414. Target system FPGA 406 is coupled to target connector 408 via connection 414. One of ordinary skill in the art will recognize that target pod 400 may also comprise other support circuitry for example fans for cooling, programmable read only-memory (PROM), or light emitting diodes (LED) as needed. Target pod 400 enables communication between an emulator and a target system.

Board manager 402 receives test signals from diagnostics or applications running on an emulator or on a host workstation as explained with respect to FIG. 3. Board manager 402 receives the signal via target connector 418. Target connector 418 may be, for example, an Ethernet connection. Board manager 402 may determine whether the test signals were received properly. If the test signal was received improperly, board manager 402 may communicate this failure to target system FPGA 406 via connection 414. Likewise, if target system FPGA 406 report error in testing target connection 410, target system FPGAs 406 may communicate the error to board managers 402 via connection 414. Board manager 402 may communicate with diagnostics or applications on the status of target connections 410 and 418 as explained with reference to FIG. 3.

Emulator interface 404 is the interface between the target connection 410 and the target pod 400. Emulator interface 404 provides an interface for connection of target connection 410 to target pod 400. Emulator interface 404 may be, for example, an optical transceiver if target connection 410 comprises an optical SerDes connection. In other embodiments, target connection 410 may comprise Ethernet, FibreChannel, InfiniBand or other connections known to those of ordinary skill in the art. In such case, appropriate emulator interface 410 would be chosen. Emulator interface 404 communicates with board manager 402 on the status of target connection 410 via connection 416. Emulator interface 404 further communicates data received over target connection 410 to target system FPGA 406 via connection 412.

Board manager 402 may communicate with emulator interface 404, for example an optical transceiver, on the status of emulator interface 404 and target connection 410 via connection 416. For example, emulator interface 404 may comprise registers that provide status information on the temperature of emulator interface 404, the receipt of an optical signal at emulator interface 404, and the intensity of the optical signal at emulator interface 404, among other information. Board manager 402 may communicate this information with diagnostics or applications as explained in connection with FIG. 3.

Target system FPGA 406 match the electrical characteristics of the emulator to the target systems. Further, target system FPGA 406 manages communications between the emulator and the target systems. In order to match the electrical characteristics of the emulator to the target systems, target system FPGA 406, for example, matches voltages or type of input (single-ended, differential).

Target system FPGA 406 also manage communications between the target system and the emulator. Target system FPGA 406 precisely time communication between domains of an emulator and a target system. During the emulation of a portion of a hardware design, the communications between domains and target system must be timed so that signals are received at the right time in the emulation process. Otherwise, signals would be received out of order and would not mimic the actual operation of the hardware design in fabricated hardware. Target system FGPA 406 also receives test signals from retiming FPGA of an emulator via target connection 410. Target system FGPA 406 may use the ECC check bits sent with the serializer/deserializer communications to test whether the signal was received properly. If the test signal was received improperly, target system FPGAs 406 may communicate this failure to board manager 402 via connection 414. Likewise, if board manager 402 report error in testing target connection 418, board manager 402 may communicate the error to target system FPGA 406 via connection 414. Target system FPGA 406 may communicate with diagnostics or applications of an emulator or host workstation via target connection 410.

Target connector 414 is coupled to target system FPGA via connection 414. Target connector 414 comprises an interface for target pod 400 to a target system or adapter for matching communication speed of emulator and target system. As one of ordinary skill in the art will recognize a speed bridge is used to match frequency of communications between an emulator and a target system.

Although the embodiments have been described with reference to the drawings and specific examples, it will readily be appreciated by those skilled in the art that many modifications and adaptations of the apparatuses and processes described herein are possible without departure from the spirit and scope of the embodiments as claimed hereinafter. Thus, it is to be clearly understood that this description is made only by way of example and not as a limitation on the scope of the claims.

We claim:

1. A functional verification system, comprising:
an emulator comprising a plurality of emulation chips, the plurality of emulation chips having programmed therein a first domain emulate a first digital hardware design and a second domain operable to emulate a second digital hardware design, the emulator further comprising a retiming field programmable gate array (FPGA) controlling timing of signals communicated between the first domain and a first target system and controlling timing of signals communicated between the second domain and a second system, the first target system being a system in which the first digital hardware design being verified in the emulator will be installed once manufactured, the second target system being a system in which the second digital hardware design being verified in the emulator will be installed once manufactured, the retiming FPGA generates test signals for testing a first set of target connections between the emulator and the first target system, and a mux that selects between the first set of target connections and a second set of target connections, the second set of target connections being between the emulator and the second target system;
a first target system FPGA that receives test signals from the retiming FPGA, via the mux, over the first set of target connections, and sends the test signals over the first set of target connections to the first target system, wherein the first target system FPGA determines failure of any of the first set of target connections and generates a first failure indication; and;
a first board manager in communication with the first target system FPGA and the emulation system, the first board manager device receives the first failure indication from the first target system FPGA and reports said first failure indication, wherein the emulator continues to emulate the second digital hardware design of the second domain while testing the first set of target connections.

2. The functional verification system of claim 1 wherein the target system FPGA is further receives a report on the status of the first set of target connections from the board manager.

3. The emulator of claim 1, wherein the first set of target connections comprise optical serializer/deserializer connections.

4. The emulator of claim 1, wherein the first domain and the second domain comprise emulation application specific integrated circuits (ASICs).

5. The emulator of claim 1, wherein the first domain and the second domain comprise field programmable gate arrays (FPGAs).

6. The emulator of claim 1, wherein the first set of target connections comprise Ethernet connections.

7. The emulator of claim 1, further comprising:
a second target system FPGA that receives test signals from the retiming FPGA, via the mux, over the second set of target connections, and sends the test signals over the second set of target connections to the second target system, wherein the second target system FPGA determines failure of any of the second set of target connections and generates a second failure indication; and;

a second board manager in communication with the target system FPGA and the emulation system, the second board manager device receives a second failure indication from the target system FPGA and reports said second failure indication, wherein the emulator continues to emulate the first digital hardware design of the first domain while testing the second set of target connections.

8. The emulator of claim 1, wherein the first target system FPGA and the first board manager are contained within a pod enclosure.

9. The emulator of claim 7, wherein the second target system FPGA and the second board manager are contained within a pod enclosure.

* * * * *